(12) United States Patent
Hirao et al.

(10) Patent No.: US 11,011,678 B2
(45) Date of Patent: *May 18, 2021

(54) GROUP 13 ELEMENT NITRIDE LAYER, FREE-STANDING SUBSTRATE AND FUNCTIONAL ELEMENT

(71) Applicant: NGK INSULATORS, LTD., Nagoya (JP)

(72) Inventors: Takayuki Hirao, Nisshin (JP); Hirokazu Nakanishi, Nagoya (JP); Mikiya Ichimura, Ichinomiya (JP); Takanao Shimodaira, Nagoya (JP); Masahiro Sakai, Nagoya (JP); Takashi Yoshino, Ama (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/797,581

(22) Filed: Feb. 21, 2020

(65) Prior Publication Data
US 2020/0194626 A1 Jun. 18, 2020

Related U.S. Application Data

(63) Continuation of application No. PCT/JP2017/034035, filed on Sep. 21, 2017.

(30) Foreign Application Priority Data

Aug. 24, 2017 (WO) .................. PCT/JP2017/030373

(51) Int. Cl.
*H01L 33/00* (2010.01)
*H01L 33/32* (2010.01)
(Continued)

(52) U.S. Cl.
CPC .......... *H01L 33/32* (2013.01); *C01B 21/0602* (2013.01); *C01B 21/0632* (2013.01);
(Continued)

(58) Field of Classification Search
CPC ........................... H01L 33/32; C01B 21/0602
See application file for complete search history.

(56) References Cited

U.S. PATENT DOCUMENTS

2005/0098090 A1    5/2005   Hirota et al.
2006/0170000 A1    8/2006   Oshima
(Continued)

FOREIGN PATENT DOCUMENTS

JP    2000277803 A    10/2000
JP    2001284736 A    10/2001
(Continued)

OTHER PUBLICATIONS

U.S. Appl. No. 16/797,505, hirao et al, filed Feb. 21, 2020.*
(Continued)

*Primary Examiner* — Samuel A Gebremariam
(74) *Attorney, Agent, or Firm* — Flynn Thiel, P.C.

(57) ABSTRACT

A layer of a crystal of a group 13 nitride selected from gallium nitride, aluminum nitride, indium nitride and the mixed crystals thereof has an upper surface and a bottom surface. The upper surface of the crystal layer of the group 13 nitride includes a linear high-luminance light-emitting part and a low-luminance light-emitting region adjacent to the high-luminance light-emitting part, observed by cathode luminescence. The high-luminance light-emitting part includes a portion extending along an m-plane of the crystal of the group 13 nitride.

15 Claims, 10 Drawing Sheets

(51) Int. Cl.
| | |
|---|---|
| *C01B 21/06* | (2006.01) |
| *C09K 11/08* | (2006.01) |
| *C09K 11/62* | (2006.01) |
| *C09K 11/64* | (2006.01) |
| *C30B 29/40* | (2006.01) |
| *C30B 29/38* | (2006.01) |
| *G09G 3/3208* | (2016.01) |
| *H01L 33/18* | (2010.01) |

(52) U.S. Cl.
CPC .......... *C09K 11/0883* (2013.01); *C09K 11/62* (2013.01); *C09K 11/64* (2013.01); *C30B 29/38* (2013.01); *C30B 29/403* (2013.01); *C30B 29/406* (2013.01); *G09G 3/3208* (2013.01); *H01L 33/18* (2013.01)

(56) References Cited

U.S. PATENT DOCUMENTS

| | | | |
|---|---|---|---|
| 2009/0081857 | A1 | 3/2009 | Hanser et al. |
| 2010/0102360 | A1 | 4/2010 | Nakada et al. |
| 2011/0287222 | A1 | 11/2011 | Hirao et al. |
| 2012/0175740 | A1 | 7/2012 | Hirao et al. |
| 2015/0144956 | A1 | 5/2015 | Watanabe et al. |
| 2015/0357521 | A1 | 12/2015 | Choe |
| 2016/0020284 | A1 | 1/2016 | D'Evelyn et al. |
| 2016/0049554 | A1* | 2/2016 | Iwai ............... C30B 29/406 257/76 |
| 2016/0233380 | A1 | 8/2016 | Ichimura et al. |
| 2016/0254411 | A1 | 9/2016 | Fukuyama et al. |
| 2017/0330749 | A1 | 11/2017 | Yoshino et al. |
| 2018/0038010 | A1 | 2/2018 | Mori et al. |
| 2018/0247809 | A1 | 8/2018 | Ichimura et al. |
| 2018/0291525 | A1 | 10/2018 | Kimura et al. |
| 2020/0194621 | A1* | 6/2020 | Hirao ............... H01L 33/16 |

FOREIGN PATENT DOCUMENTS

| | | | |
|---|---|---|---|
| JP | 2005154254 | A | 6/2005 |
| JP | 2005203418 | A | 7/2005 |
| JP | 2009147271 | A | 7/2009 |
| JP | 2010168273 | A | 8/2010 |
| JP | 2010180111 | A | 8/2010 |
| JP | 5770905 | B1 | 8/2015 |
| JP | 201612717 | A | 1/2016 |
| JP | 5897790 | B2 | 3/2016 |
| JP | 2016160151 | A | 9/2016 |
| JP | 2016188172 | A | 11/2016 |
| JP | 201752660 | A | 3/2017 |
| JP | 6154066 | B2 | 6/2017 |
| WO | 2010084682 | A1 | 7/2010 |
| WO | 2011046203 | A1 | 4/2011 |
| WO | 2015068458 | A1 | 5/2015 |
| WO | 2016121853 | A1 | 8/2016 |
| WO | 2017077989 | A1 | 5/2017 |

OTHER PUBLICATIONS

English language International Preliminary Report on Patentability and Written Opinion of the International Searching Authority, issued in corresponding International Application No. PCT/JP2017/034035, dated Nov. 28, 2017 (6 pages).
International Preliminary Report on Patentability and Written Opinion of the International Searching Authority with English translation, issued in corresponding International Application No. PCT/JP2018/028558, dated Oct. 9, 2018 (19 pages).
International Search Report issued in corresponding International Application No. PCT/JP2018/028558, dated Oct. 9, 2018 (3 pages).
International Preliminary Report on Patentability and Written Opinion of the International Searching Authority with English translation, issued in corresponding International Application No. PCT/JP2018/028206, dated Oct. 9, 2018 (18 pages).
International Search Report issued in corresponding International Application No. PCT/JP2018/028206, dated Oct. 9, 2018 (3 pages).
International Preliminary Report on Patentability and Written Opinion of the International Searching Authority with English translation, issued in corresponding International Application No. PCT/JP2018/029358, dated Oct. 9, 2018 (19 pages).
International Search Report issued in corresponding International Application No. PCT/JP2018/029358, dated Oct. 9, 2018 (3 pages).
Co-pending U.S. Appl. No. 16/797,961, filed Feb. 21, 2020.
Co-pending U.S. Appl. No. 16/797,685, filed Feb. 21, 2020.
Co-pending U.S. Appl. No. 16/797,791, filed Feb. 21, 2020.
International Search Report issued in corresponding International Application No. PCT/JP2017/034035 with English translation dated Nov. 28, 2017 (5 pages).
Written Opinion of International Searching Authority issued in corresponding International Application No. PCT/JP2017/034035 dated Nov. 28, 2017 (3 pages).
English Decision to Grant a Patent for JP 6639752B (Application No. 2019-537547) (3 pages).
Co-pending U.S. Appl. No. 16/797,505, filed Feb. 21, 2020.
Chinese Office Action with English Translation issued in corresponding Chinese Application No. 201780093870.X, dated Jul. 2, 2020 (15 pages).

* cited by examiner

GROUP 13 ELEMENT NITRIDE LAYER, FREE-STANDING SUBSTRATE AND FUNCTIONAL ELEMENT

CROSS-REFERENCE TO RELATED APPLICATIONS

This application is a continuation application of PCT/JP2017/034035, filed Sep. 21, 2017, which claims priority to PCT/JP2017/030373, filed Aug. 24, 2017, the entire contents all of which are incorporated hereby by reference.

TECHNICAL FIELD

The present invention relates to a layer of a nitride of a group 13 element, a free-standing substrate and a functional device.

BACKGROUND ARTS

It has been known that light-emitting devices such as light emitting diodes (LEDs) use sapphire (α-alumina single crystal) as a monocrystalline substrate with various types of gallium nitride (GaN) layers formed thereon. For example, light-emitting devices have been mass-produced having a structure in which an n-type GaN layer, a multiple quantum well (MQW) layer with an InGaN quantum well layer and a GaN barrier layer laminated alternately therein and a p-type GaN layer are formed in a laminated manner in this order on a sapphire substrate.

Patent document 1 describes a gallium nitride layer composed of polycrystalline gallium nitride having many gallium nitride monocrystalline grains, including many columnar gallium nitride monocrystalline grains laterally arranged.

Patent document 2 describes a gallium nitride layer composed of polycrystalline gallium nitride having many gallium nitride monocrystalline grains, including many columnar gallium nitride monocrystalline grains laterally arranged. Further, an average tilt angle on a surface (an average value of inclination of crystal orientation (crystalline axis) with respect to a normal line of the surface) is 1° to 10°.

According to patent document 3, inclusions are contained at a high concentration from a bottom surface to an intermediate position, and between the intermediate position and the upper surface, a plurality of grain boundaries having a low concentration of the inclusions are formed from the bottom surface in a diagonal direction. Further, the grain boundaries are elongated in the diagonal direction of an angle of 50 to 70° with respect to c-axis.

Patent document 5 describes gallium nitride crystals having a low dislocation density by increasing a ratio of Ga in a melt.

RELATED ART DOCUMENTS

Patent Documents (Patent document 1) Japanese Patent No. 5770905B
(Patent document 2) Japanese Patent No. 6154066B
(Patent document 3) Japanese Patent No. 5897790B
(Patent document 4) WO 2011/046203 A1
(Patent document 5) WO 2010/084682 A1

SUMMARY OF THE INVENTION (Object to be Solved by the Invention)

In the case that a light-emitting device is produced on the gallium nitride crystal of patent document 1 or 2, it has been proved that current path may be interrupted resulting in a reduction of luminance efficiency, although it is dependent on a balance between the size of the device and grain size. Although the reasons are not clear, the anisotropic property of the orientations of the monocrystalline grains may affect the reduction.

According to gallium nitride crystals of patent documents 3 and 4, as its size is made larger, it may be difficult to control the flow of the melt over the whole surface of a substrate so that voids may be left on the peripheral part of the crystal.

According to patent document 5, although it is possible to reduce the dislocation density by applying a high Ga ratio and by controlling the flow of the flux to increase the grain size, voids tend to be included between the grains.

An object of the present invention is, in a layer of a crystal of a group 13 nitride having an upper surface and lower surface and composed of a crystal of the group 13 nitride selected from gallium nitride, aluminum nitride, indium nitride or the mixed crystals thereof, to provide a microstructure capable of reducing a dislocation density and reducing the deviation of a property as a whole.

(Solution for the Object)

The present invention provides a layer of a crystal of a nitride of a group 13 element, said crystal of said nitride being selected from gallium nitride, aluminum nitride, indium nitride and the mixed crystals thereof, said layer comprising an upper surface and a bottom surface, wherein the upper surface comprises a linear high-luminance light-emitting part and a low-luminance light-emitting region adjacent to the high-luminance light-emitting part and wherein the high-luminance light-emitting part comprises a portion extending along an m-plane of the crystal of the nitride of the group 13 element, said upper surface being observed by cathode luminescence.

The present invention further provides a free-standing substrate comprising the layer of the nitride of said group 13 element.

The present invention further provides a composite substrate comprising:
  a supporting body; and
  the layer of the nitride of the group 13 element provided on the supporting body.

The present invention further provides a functional device comprising:
  the free-standing substrate; and
  a functional layer provided on the layer of the nitride of the group 13 element.

The present invention further provides a functional device comprising:
  the composite substrate; and
  a functional layer provided on the layer of the nitride of the group 13 element.

Effects of the Invention

According to the present invention, in the case that the upper surface of the layer of the crystal of the nitride of the group 13 element is observed by cathode luminescence, the layer includes the linear high-luminance light-emitting part and the low-luminance light-emitting region adjacent to the high-luminance light-emitting part, and the high-luminance light-emitting part includes a portion extending along the m-plane of the crystal of the group 13 nitride. The linear high-luminance light-emitting part appears on the upper surface, indicating that a dopant and minute components and the like contained in the crystal of the group 13 nitride form the thick high-luminance light-emitting part. At the same time, the linear high-luminance light-emitting part extends along the m-plane, indicating that dopants are concentrated along the m-plane during the crystal growth and that the thick linear high-luminance light-emitting part appears along the m-plane.

According to the layer of the crystal of the group 13 nitride having the novel microstructure, it is possible to provide the layer of the crystal of the group 13 nitride in which the dislocation density can be made lower and the deviation of a property can be reduced as a whole, even in the case of a larger size (for example, the diameter is made 6 inches or larger).

EMBODIMENTS FOR CARRYING OUT THE INVENTION

The present invention will be described further in detail.
(Layer of Crystal of Group 13 Nitride)

A layer of a crystal of a group 13 nitride of the present invention is composed of a crystal of a group 13 nitride selected from gallium nitride, aluminum nitride, indium nitride and the mixed crystals thereof, and includes an upper surface or lower surface. For example, as shown in FIG. 1(b), the upper surface 13a and bottom surface 13b of the layer 13 of the crystal of the group 13 nitride are opposed to each other.

The nitride forming the layer of the crystal of the group 13 nitride includes gallium nitride, aluminum nitride, indium nitride or the mixed crystals thereof. GaN, AlN, InN, $Ga_xAl_{1-x}N$ (1>x>0), $Ga_xIn_{1-x}N$ (1>x>0) and $Ga_xAl_yIn_zN$ (1>x>0, 1>y>0, x+y+z=1) are specifically listed.

More preferably, the nitride forming the layer of the crystal of the group 13 nitride is a gallium nitride series nitride. GaN, $Ga_xAl_{1-x}N$ (1>x>0.5), $Ga_xIn_{1-x}N$ (1>x>0.4) and $Ga_xAl_yIn_zN$ (1>x>0.5, 1>y>0.3, x+y+z=1) are specifically listed.

The nitride of the group 13 element may be doped with zinc, calcium or another n-type dopant or p-type dopant, and in this case, the polycrystalline group 13 nitride can be used as a member or a layer other than the base material, such as a p-type electrode, an n-type electrode, a p-type layer, or an n-type layer. A preferable example of a p-type dopant may be one type or more selected from the group consisting of beryllium (Be), magnesium (Mg), strontium (Sr), and cadmium (Cd). A preferable example of an n-type dopant may be one type or more selected from the group consisting of silicon (Si), germanium (Ge), tin (Sn), and oxygen (O).

Figure 2:
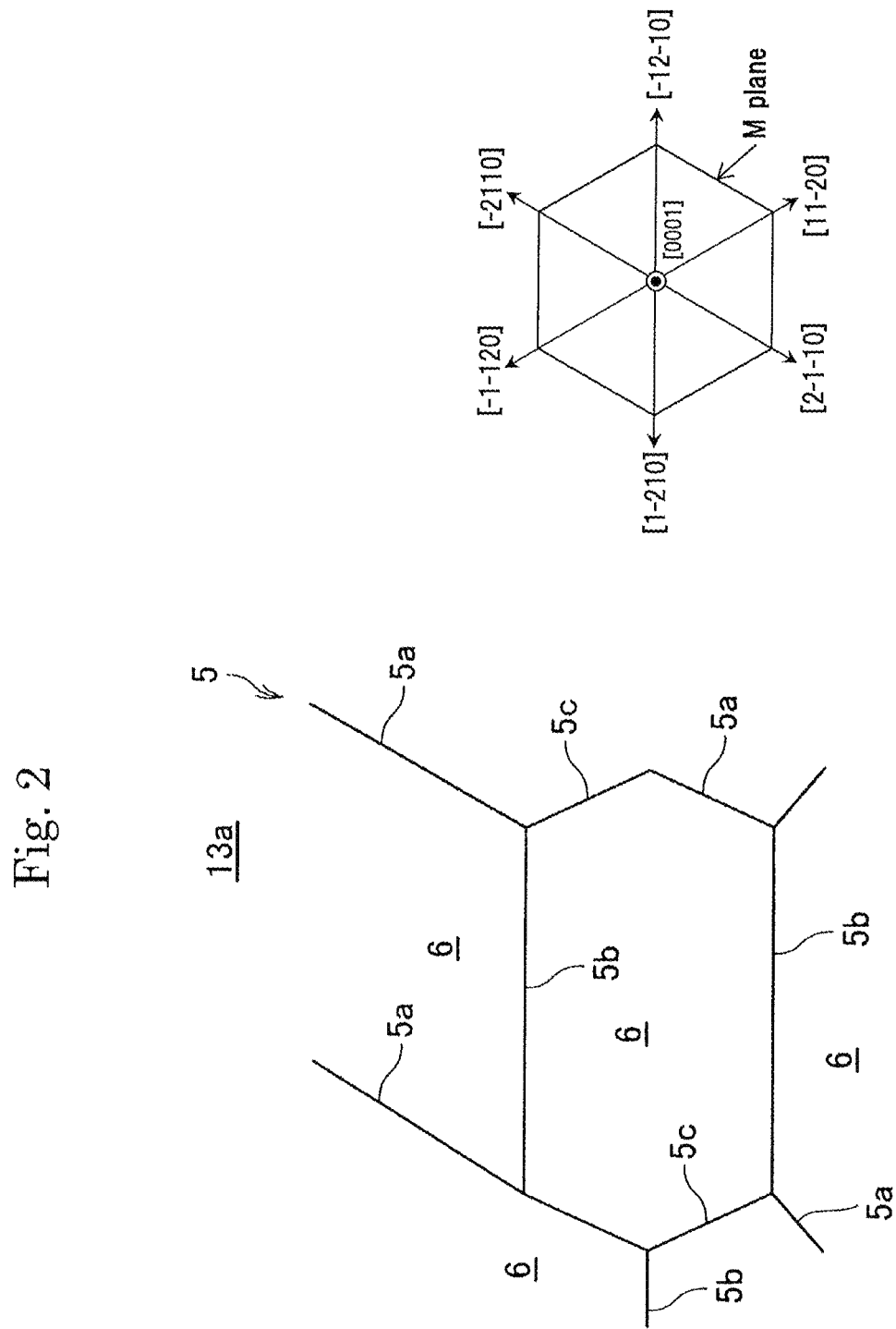
FIG. 2 is a diagram schematically illustrating a cathode luminescence image of an upper surface 13a of the layer 13 of the crystal of the group 13 nitride.

Here, in the case that the upper surface 13a of the layer 13 of the crystal of the group 13 nitride is observed by cathode luminescence (CL), as schematically shown in FIG. 2, the upper surface 13a includes the linear high-luminance light-emitting part 5 and low-luminance light-emitting region 6 adjacent to the high-luminance light-emitting part 5.

Here, the observation by CL is performed as follows.

A scanning type electron microscope (SEM) with a CL detector for the CL observation is used. For example, in the case that a scanning type electron microscope ("S-3400N" supplied by HITACHI Hi Technologies Co. Ltd.) equipped with Mini CL system produced by Gatan is used, it is preferred to insert the Cl detector between a sample and an object lens under the measurement conditions of an acceleration voltage of 10 kV, probe current "90", at a working distance (W. D.) of 22.5 mm and a magnitude of 50 fold.

Further, the high-luminance light-emitting part and low-luminance light-emitting region are distinguished based on the observation by the cathode luminescence as follows.

Figure 10:
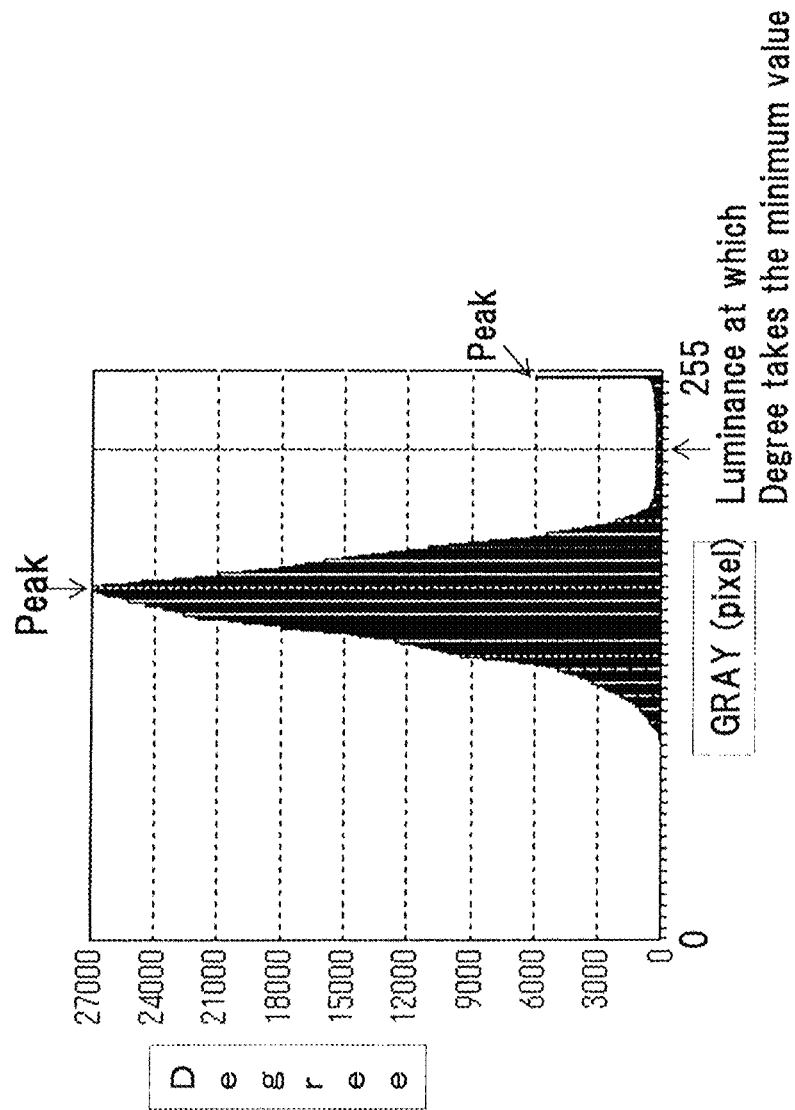
FIG. 10 shows a histogram of a gray scale generated from the CL image.

As to the brightness of an image observed by CL under the conditions of an acceleration voltage of 10 kV, probe current "90", at a working distance (W. D.) of 22.5 mm and a magnitude of 50 fold, an image processing software (for example, "WinRoof Ver 6. 1.3" supplied by Mitani corporation) is used to prepare a histogram of a gray scale of 256 grades whose vertical axis shows a degree and horizontal axis shows brightness (GRAY). As shown in FIG. 10, two peaks are confirmed in the histogram. The brightness at which the degree takes its minimum value between the two peaks is defined as a boundary, and the higher side is defined as the high-luminance light-emitting part and the lower side is defined as the low-luminance light-emitting region.

Further, on the upper surface of the layer of the crystal of the group 13 nitride, the linear high-luminance light-emitting part and low-luminance light-emitting region are adjacent to each other. The adjacent low-luminance light-emitting regions are distinguished by the linear high-luminance light-emitting part between them. Here, the linearity of the high-luminance light-emitting part means that the high-luminance light-emitting part is elongated lengthwise between the adjacent low-luminance light-emitting regions to provide a boundary line.

Here, the line of the high-luminance light-emitting part may be a straight line, curved line or a combination of the straight line and curved line. The curved line includes various shapes such as circle, ellipse, parabola and hyperbola. Further, the high-luminance light-emitting parts extending in different directions may be continuous with each other, and an end of the high-luminance light-emitting part may be discontinued.

On the upper surface of the layer of the crystal of the group 13 nitride, the low-luminance light-emitting region may be the exposed surface of the crystal of the group 13 nitride grown thereunder and is extended two-dimensionally and in a planar shape. On the other hand, the high-luminance light-emitting part is of a linear shape and extended one-dimensionally to provide the boundary line dividing the adjacent low-luminance light-emitting regions. For example, it is considered that dopant components, minute components and the like are discharged from the crystal of the group 13 nitride grown from the bottom and concentrated between the nitride crystals adjacent to each other during the growth, thereby generating a linear and strong light-emitting part between the adjacent low-luminance light-emitting regions on the upper surface.

Figure 3:
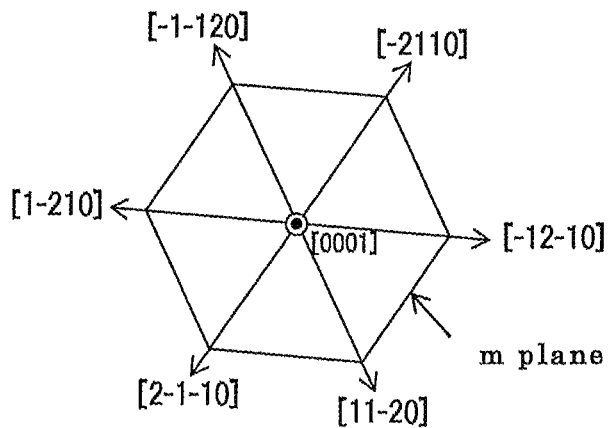
FIG. 3 is a photograph showing a cathode luminescence image of an upper surface 13a of the layer 13 of the crystal of the group 13 nitride.
Figure 3:
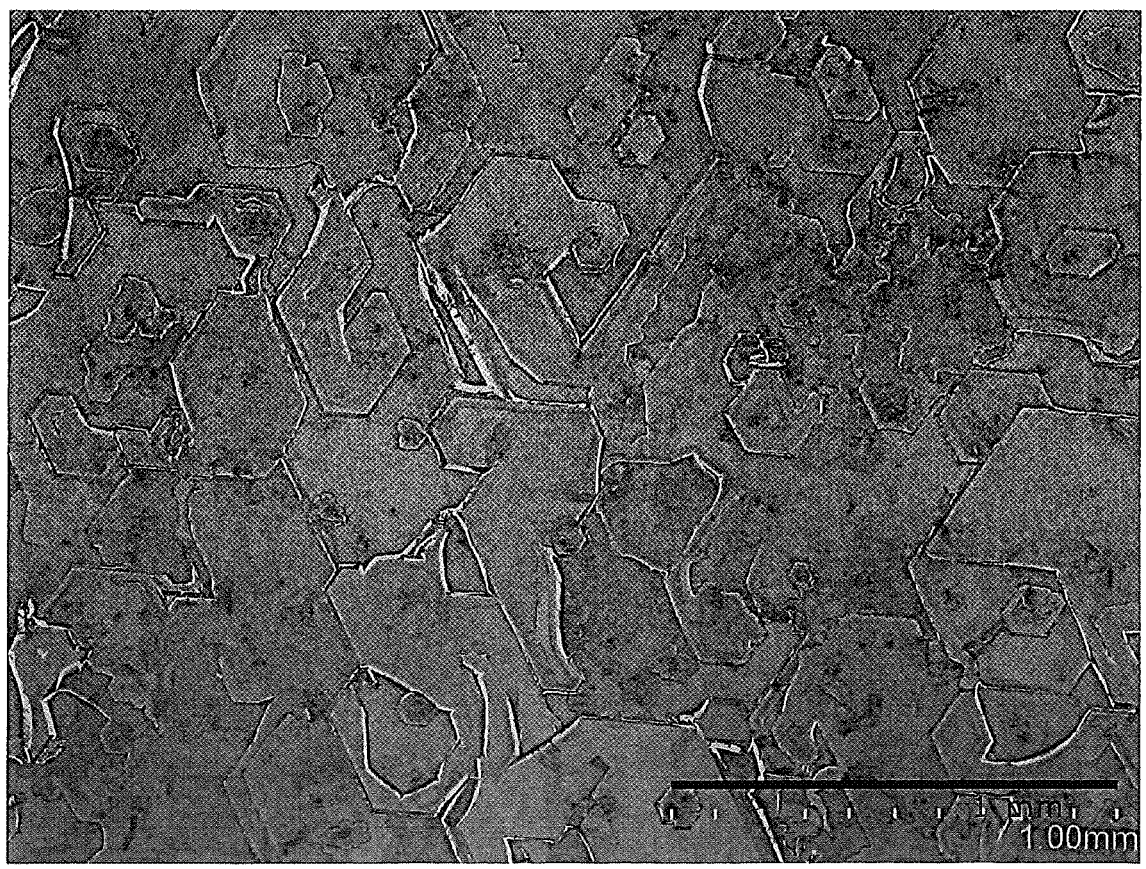
Figure 4:
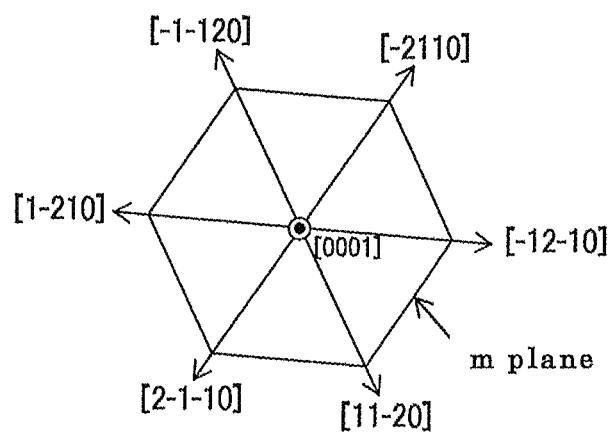
FIG. 4 is a photograph showing an enlarged view of FIG. 3.
Figure 4:
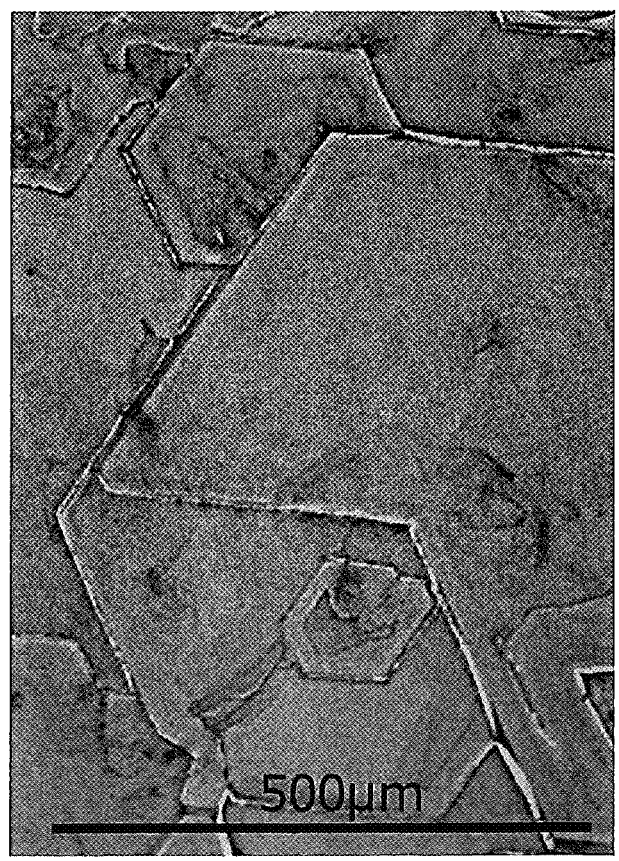
Figure 5:
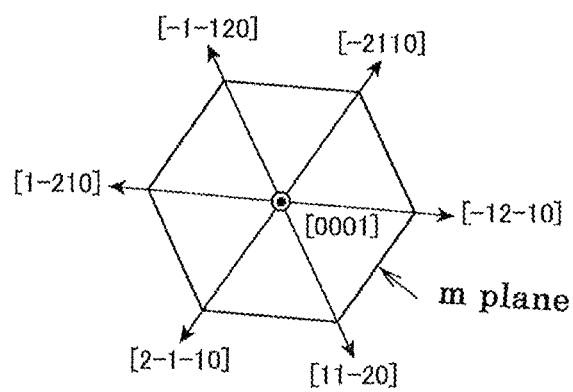
FIG. 5 is a diagram corresponding with the cathode luminescence image of FIG. 4.
Figure 5:
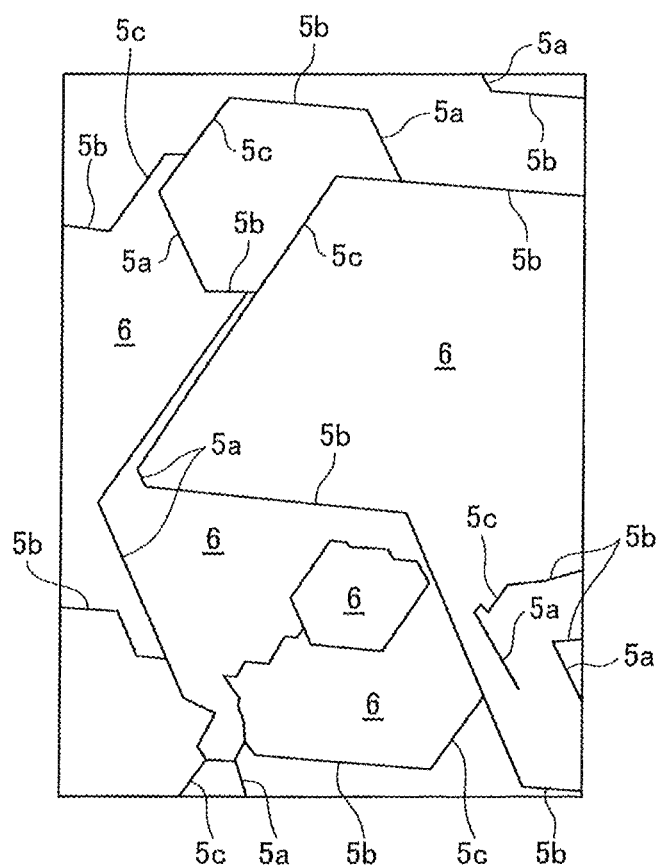

For example, FIG. 3 shows a photograph taken by CL observation of the upper surface of the layer of the crystal of the group 13 nitride obtained in the inventive example. FIG. 4 is an enlarged view of FIG. 3, and FIG. 5 schematically shows a diagram corresponding to FIG. 4. It is proved that the low-luminance light-emitting region is extended two-dimensionally, and the high-luminance light-emitting part is linear-shaped and elongated one-dimensionally as the boundary line dividing the adjacent low-luminance light-emitting regions.

As such, the shape of the low-luminance light-emitting region is not particularly limited, and normally elongated planarly and two-dimensionally. On the other hand, it is necessary that the line of the high-luminance light-emitting part is of an elongate shape. From this viewpoint, the width of the high-luminance light-emitting part may preferably be 100 µm or smaller, more preferably be 20 µm or smaller and particularly preferably be 5 µm or smaller. Further, the width of the high-luminance light-emitting part is normally 0.01 µm or larger.

Further, from the viewpoint of the present invention, the ratio (length/width) of the length and width of the high-luminance light-emitting part may preferably be 1 or higher and more preferably be 10 or higher.

Further, from the viewpoint of the present invention, on the upper surface, the ratio of the area of the high-luminance light-emitting parts with respect to the area of the low-luminance light-emitting regions (area of high-luminance light-emitting parts/area of low-luminance light-emitting regions) may preferably be 0.001 or higher and more preferably be 0.01 or higher.

Further, from the viewpoint of the present invention, on the upper surface, the ratio of the area of the high-luminance light-emitting parts with respect to the area of the low-luminance light-emitting regions (area of high-luminance light-emitting parts/area of low-luminance light-emitting regions) may preferably be 0.3 or lower and more preferably be 0.1 or lower.

According to a preferred embodiment, the high-luminance light-emitting part includes a portion extending along the m-plane of the crystal of the nitride of the group 13 element. For example, according to the examples shown in FIGS. 2 and 5, the high-luminance light-emitting part 5 is elongated in an elongate shape and includes portions 5a, 5b and 5c elongated along the m-plane. The directions along the m-plane of the hexagonal crystal of the nitride of the group 13 element is, specifically, [−2110], [−12-10], [11-20], [2-1-10], [1-210] or [−1-120] direction. The high-luminance light-emitting part 5 includes a part of a side of a substantially hexagonal shape reflecting the hexagonal crystal. Further, the linear high-luminance light-emitting part is elongated along the m-plane, meaning that the lengthwise direction of the high-luminance light-emitting part is elongated in the direction of each of [−2110], [−12-10], [11-20], [2-1-10], [1-210] and [−1-120]. Specifically, it is permitted that the lengthwise direction of the linear high-luminance light-emitting part is inclined preferably by ±1° and more preferably by ±0.3° with respect to the m-plane.

According to a preferred embodiment, on the upper surface, the linear high-luminance light-emitting part is elongated approximately along the m-plane of the crystal of the nitride of the group 13 element. It means that a main portion of the high-luminance light-emitting part is elongated along the m-plane and preferably the continuous phase of the high-luminance light-emitting part is elongated approximately along the m-plane. In this case, the portion extending in the direction along the m-plane may preferably occupy 60 percent or more, more preferably 80 percent or more and may occupy substantially the whole of the whole length of the high-luminance light-emitting part.

According to a preferred embodiment, on the upper surface of the layer of the crystal of the group 13 nitride, the high-luminance light-emitting part constitutes a continuous phase and the low-luminance light-emitting region constitutes a discontinuous phase divided by the high-luminance light-emitting part. For example, as shown in the schematic views of FIGS. 2 and 5, the linear high-luminance light-emitting part 5 forms the continuous phase and the low-luminance light-emitting regions form the continuous phases divided by the high-luminance light-emitting part.

Here, although the continuous phase means that the high-luminance light-emitting part 5 is continuous on the upper surface, it does not necessarily mean that all the high-luminance light emitting parts 5 are completely continuous, and it is permitted that a small part of the high-luminance light-emitting part 5 is separated from the other high-luminance light-emitting part 5 as long as it does not affect the whole pattern.

Further, the dispersed phase means that the low-luminance light-emitting regions 6 are approximately divided by the high-luminance light-emitting part 5 into many regions which are not continuous. Further, in the case that the low-luminance light-emitting regions 6 are divided by the high-luminance light-emitting part 5 on the upper surface, it is permitted that the low-luminance light-emitting regions 6 are continuous inside of the layer of the crystal of the group 13 nitride.

According to a preferred embodiment, the half value width of the reflection at the (0002) plane of the X-ray rocking curve on the upper surface of the crystal layer of the group 13 nitride is 3000 seconds or less and 20 seconds or more. It indicates that the surface tilt angle is low and the crystal orientations are highly oriented, as a whole, as a single crystal, on the upper surface. As the microstructure has the cathode luminescence distribution as described above and the crystal orientations at the surface are highly orientated as a whole as such, it is possible to reduce the distribution of a property on the upper surface of the layer of the crystal of the group 13 nitride, to obtain uniform properties of various kinds of functional devices provided thereon and to improve the yield of the functional devices.

From this viewpoint, the half value width of the reflection at the (0002) plane of the X-ray rocking curve on the upper surface of the crystal layer of the group 13 nitride may preferably be 1000 seconds or less and 20 seconds or more, and more preferably be 500 seconds or less and 20 seconds or more. Here, it is actually difficult to make the half value width of the reflection at the (0002) plane of the X-ray rocking curve on the upper surface of the crystal layer of the group 13 nitride lower than 20 seconds.

Further, the reflection at the (0002) plane of the rocking curve is measured as follows. An XRD system (for example, D8-DISCOVER supplied by Bruker-AXS) is used to perform the measurement under the conditions of a tube voltage of 40 kV, a a tube current of 40 mA, a collimator size of 0.1 mm, an anti-scattering slit of 3 mm, a range of ω=angle of peak position of ±0.3°, an co step width of 0.003° and a counting time of 1 second. According to the measurement, it is preferred to use a Ge (022) non-symmetrical monochromator to convert a CuKα ray to a parallel and monochrome ray (half value width of 28 seconds) and to perform the measurement after standing the axis at a tilt angle CHI of about 0°. Then, the half value width of reflection at the (0002) plane of the X-ray rocking curve can be calculated by using an XRD analysis software (supplied by Bruker-AXS, LEPTOS4.03) and performing a peak search. It is preferred to apply a peak search condition of Noise filter "10", Threshold "0.30" and Points "10".

Figure 6:
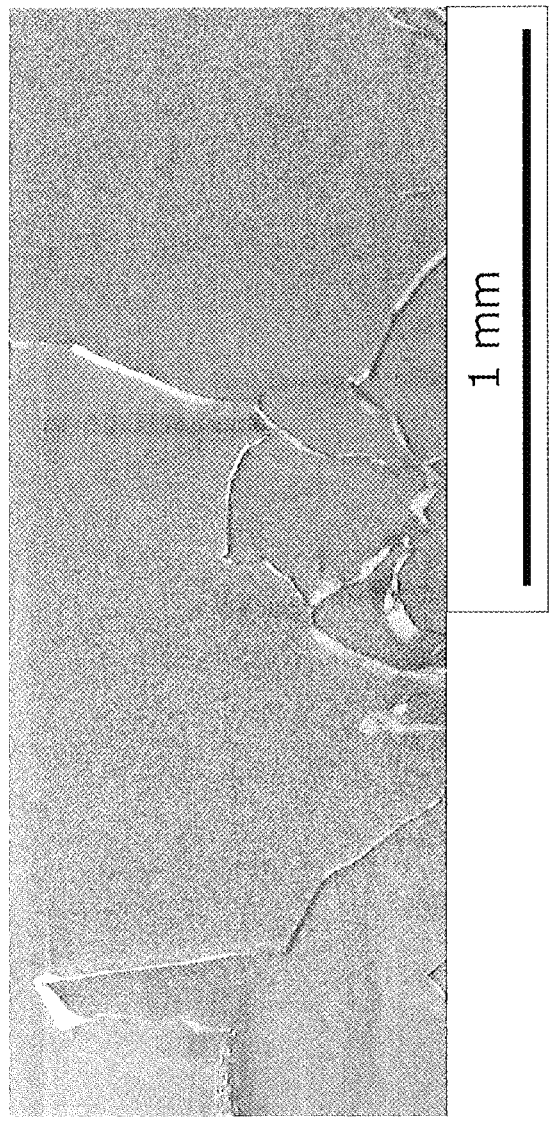
FIG. 6 is a photograph showing a cathode luminescence image of a cross section of the layer 13 of the crystal of the group 13 nitride.

In the case that a cross section substantially perpendicular to the upper surface of the crystal layer of the group 13 nitride is observed by CL, as shown in FIG. 6, linear high-luminance light-emitting parts emitting white light may be observed. Here, as shown in FIG. 6, it is proved that the low-luminance light-emitting region is extended planarly and two-dimensionally and that the high-luminance light-emitting part is elongated linearly to form a kind of a boundary line dividing the adjacent low-luminance light-emitting regions. The method of observing the high-luminance light-emitting part and low-luminance light emitting region is the same as the method of observing the high-luminance light-emitting part and low-luminance light-emitting region on the upper surface.

The shape of the low-luminance light-emitting region on the cross section of the layer of the crystal of the group 13 nitride is not particularly limited, and is normally elongated planarly and two-dimensionally. On the other hand, it is necessary that the line formed by the high-luminance light-emitting part is of an elongate shape. From this viewpoint, the width of the high-luminance light-emitting part may preferably be 100 μm or smaller and more preferably be 20 μm or smaller. Further, the width of the high-luminance light-emitting part is normally 0.01 μm or larger.

Further, from the viewpoint of the present invention, the ratio of the length and width (length/width) of the light-emitting part at the cross section of the crystal layer of the group 13 nitride may preferably be 1 or larger and more preferably be 10 or larger.

According to a preferred embodiment, on the cross section substantially perpendicular to the upper surface of the layer of the crystal of the group 13 nitride, the linear high-luminance light-emitting part forms a continuous phase, and the low-luminance light-emitting region forms a discontinuous phase divided by the high-luminance light-emitting part. For example, according to a photograph taken by CL of FIG. 6, the linear high-luminance light-emitting part forms the continuous phase, and the low-luminance light-emitting region forms the discontinuous phase divided by the high-luminance light-emitting part.

Here, the continuous phase means that the high-luminance light-emitting part is continuous on the cross section and does not necessarily means that all the high-luminance light-emitting parts are completely continuous. It is thus approved that a small portion of the high-luminance light-emitting parts are separated from the other high-luminance light-emitting parts as far as it does not affect the whole pattern.

Further, the discontinuous phase means that the low-luminance light-emitting regions are approximately divided by the high-luminance light-emitting part into many regions which are not continuous.

According to a preferred embodiment, voids are not observed on the cross section substantially perpendicular to the upper surface of the layer of the crystal of the group 13 nitride. That is, as shown in the SEM photograph of FIG. 7 in the same visual field as the photograph of FIG. 6, voids (spaces) and crystal phases other than the crystals of the group 13 nitride are not observed. Here, the presence of the voids is observed as follows.

The voids are observable by observing a cross section substantially perpendicular to the upper surface of the layer of the crystal of the group 13 nitride by a scanning type electron microscope (SEM), and the void is defined as a space whose maximum width is 1 μm to 500 μm. A scanning type electron microscope ("S-3400N" supplied by HITACHI Hi Technologies Co. Ltd.) is used for the SEM observation, for example. It is preferred to apply the measurement conditions of an acceleration voltage of 15 kV, a probe current "60", a working distance (W. D.) of 6.5 mm and a magnitude of 100 fold.

Further, in the case that the cross section substantially perpendicular to the upper surface of the layer of the crystal of the group 13 nitride is observed by the scanning type electron microscope (under the measurement conditions as described above), clear grain boundaries accompanied with structural macro defects such as voids are not observed. According to such a microstructure, it is considered that the increase in the resistance or deviation of a property due to the clear grain boundaries can be suppressed in the case that a functional device such as a light-emitting device is produced on the layer of the crystal of the group 13 nitride.

Further, according to a preferred embodiment, the dislocation density on the upper surface of the layer of the crystal of the group 13 nitride is $1\times10^2/cm^2$ or higher and $1\times10^6/cm^2$ or lower. It is particularly preferred to make the dislocation density $1\times10^6/cm^2$ or lower, from the viewpoint of improving the properties of the functional device. From this viewpoint, the dislocation density is more preferably $1\times10^4/cm^2$ or lower. The dislocation density is to be measured as follows.

A scanning type electron microscope (SEM) with a CL detector may be used for the measurement of the dislocation density. For example, in the case that a scanning type electron microscope ("S-3400N" supplied by HITACHI Hi Technologies Co. Ltd.) equipped with Mini CL system produced by Gatan is used for the CL observation, the dislocated positions are observed as dark spots that do not emit light. The density of the dark spots is measured to calculate the dislocation density. The density is measured under the measurement conditions of an acceleration voltage of 10 kV, a probe current "90", a working distance (W. D.) of 22.5 mm and a magnitude of 1200 fold, while the CL detector is inserted between a sample and an object lens.

Further, according to a preferred embodiment, the half value widths of the reflection at the (0002) plane and of the reflection at the (1000) plane of the X-ray rocking curve on the upper surface of the crystal layer of the group 13 nitride are 3000 seconds or lower and 20 seconds or higher and 10000 seconds or lower and 20 seconds or higher, respectively. It means that both the surface tilt angle and surface twist angle on the upper surface are low, and that the crystal orientations are highly orientated as a whole as a single crystal. As the microstructure has the crystal orientations at the surface highly orientated as a whole as such, it is possible to reduce the distribution of properties on the upper surface of the layer of the crystal of the group 13 nitride, to obtain uniform properties of various functional devices provided thereon and to improve the yield of the functional devices.

Further, according to a preferred embodiment, the half value width of the reflection at the (1000) plane of the X-ray rocking curve on the upper surface of the crystal layer of the group 13 nitride is 10000 seconds or lower and 20 seconds or higher. It indicates that the surface twist angle is very low on the upper surface and that the crystal orientations are highly orientated as a whole as a single crystal. As the microstructure has the cathode luminescence distribution as described above and the crystal orientations on the surface are highly orientated as a whole as such, it is possible to reduce the distribution of properties at the upper surface of the crystal layer of the group 13 nitride, to obtain uniform properties of various functional devices provided thereon and to improve the yield of the functional devices.

From this viewpoint, the half value width of the reflection at the (1000) plane of the X-ray rocking curve on the upper surface of the crystal layer of the group 13 nitride may preferably be 5000 seconds or lower, more preferably be 1000 seconds or lower and more preferably be 20 seconds or higher. Further, it is actually difficult to make the half value width to a value lower than 20 seconds.

Further, the reflection at the (1000) plane of the rocking curve is measured as follows. An XRD system (for example, D8-DISCOVER supplied by Bruker-AXS) is used to perform the measurement under the conditions of a tube voltage of 40 kV, a tube current of 40 mA, no collimator, an anti-scattering slit of 3 mm, a range of ω=angle of a peak position of ±0.3°, an ω step width of 0.003° and a counting time of 4 seconds. According to the measurement, it is preferred to use a Ge (022) non-symmetrical reflection monochromator to convert a CuKα ray to a parallel and monochrome ray (half value width of 28 seconds) and to perform the measurement after standing the axis at a tilt angle CHI of about 0°. Then, the half value width of reflection at the (1000) plane of X-ray rocking curve can be calculated by using an XRD analysis software (supplied by Bruker-AXS, LEPTOS4.03) and performing a peak search. It is preferred to apply a peak search condition of Noise filter "10", Threshold "0.30" and Points "10".

(Preferred Example of Production)

A preferred embodiment of production of the crystal layer of the group 13 nitride will now be exemplified.

The crystal layer of the group 13 nitride can be produced by forming a seed crystal layer on an underlying substrate and by forming the crystal layer of the nitride of the group 13 element.

For example, as exemplified in FIG. 1, it is used the underlying substrate formed by forming an alumina layer 2 on a single crystal substrate 1. The material of the single crystal substrate 1 includes sapphire, AlN template, GaN template, free-standing GaN substrate, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ and SCAM ($ScAlMgO_4$). Further, a cubic perovskite composite oxide represented by the composition formula $[A_{1-y}(Sr_{1-x}Ba_x)_y][(Al_{1-z}Ga_z)_{1-u}D_u]O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) may be used.

The method of forming the alumina layer 2 includes known methods such as sputtering, MBE (molecular beam epitaxy), vapor deposition, mist CVD method, sol-gel method, aerosol deposition (AD) method, and the method of producing an alumina sheet by tape casting or the like and adhering the alumina sheet onto the single crystal substrate, and sputtering is particularly preferred. Optionally, the alumina layer may be subjected to heat treatment, plasma treatment or ion beam irradiation after the formation. The method of heat treatment is not particularly limited, and the heat treatment may be performed under an air atmosphere, vacuum, reducing atmosphere such as hydrogen or the like or inert atmosphere such as nitrogen, argon or the like. The heat treatment may be further performed under a pressure using a hot press (HP) furnace, a hot isostatic press (HIP) furnace or the like.

As the underlying substrate, a sapphire substrate subjected to the heat treatment, plasma treatment or ion beam irradiation as described above may further be used.

Figure 1A:
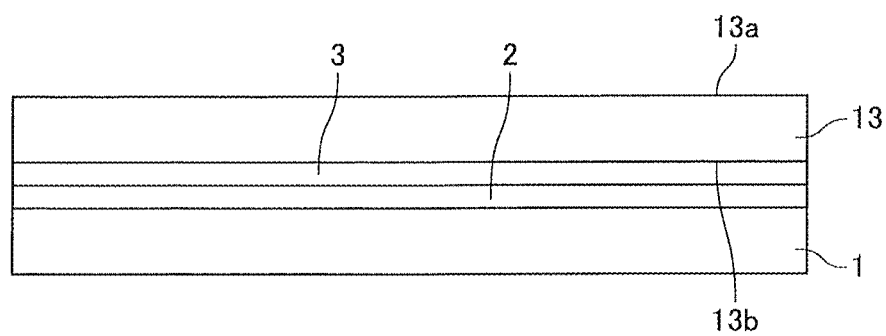
FIG. 1(a) shows the state that an alumina layer 2, a seed crystal layer 3 and a layer 13 of a crystal of a group 13 nitride are provided on a supporting body 1.
Figure 1B:
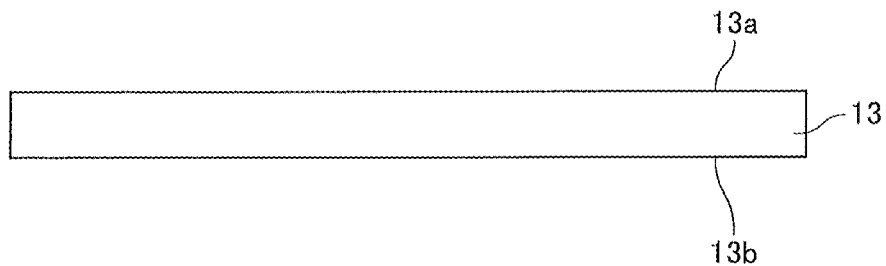
FIG. 1(b) shows the layer 13 of the crystal of the group 13 nitride separated from the supporting body.

Then, as shown in FIG. 1(a), a seed crystal layer 3 is provided on the alumina layer 2 produced as described above or on the single crystal substrate subjected to the heat treatment, plasma treatment or ion beam irradiation as described above. The material forming the seed crystal layer 3 is composed of one or more kinds of a nitride of a group 13 element defined by IUPAC. The group 13 element is preferably gallium, aluminum, or indium. Specifically, the crystal of the nitride of the group 13 element may preferably be GaN, AlN, InN, $Ga_xAl_{1-x}N$ (1>x>0), $Ga_xIn_{1-x}N$ (1>x>0) or $Ga_xAl_yInN$ (1>x>0, 1>y>0).

Although the method of forming the seed crystal layer 3 is not particularly limited, vapor phase processes such as MOCVD (metal organic chemical vapor deposition), MBE (molecular beam epitaxy), HVPE (hydride vapor epitaxy), sputtering and the like, liquid phase processes such as a Na flux method, ammonothermal method, hydrothermal method and sol-gel method, a powder method utilizing the solid phase growth of powder, and the combinations thereof may be preferably listed.

For example, in the case that the seed crystal layer is formed by an MOCVD method, preferably, a low-temperature GaN buffer layer is deposited of 20 to 50 nm at 450 to 550° C. and a GaN film is then deposited in a thickness of 2 to 4 μm at 1000 to 1200° C.

The crystal layer 13 of the group 13 nitride is formed so that the crystal orientations approximately conform to the crystal orientations of the seed crystal layer 3. The method of forming the crystal layer 13 of the group 13 nitride is not particularly limited as long as its crystalline orientation is substantially aligned with the crystal orientation of the seed crystal film and/or seed crystal layer. Vapor phase methods such as MOCVD, HVPE and the like, liquid phase methods such as a Na flux method, ammonothermal method, hydrothermal method and sol-gel method, a powder method utilizing the solid phase growth of powder, and the combinations thereof may be preferably listed. The Na flux method is particularly preferred.

In the case that the crystal layer of the group 13 nitride is formed by a Na flux method, it is preferred to strongly agitate the melt to mix the melt uniformly and sufficiently. Although this agitation method includes swinging, rotation and vibration, the method is not limited thereto.

The formation of the crystal layer of the group 13 nitride by the Na flux method may preferably be performed by filling, in a crucible with the seed crystal substrate provided therein, a melt composition containing a group 13 metal, Na metal and optionally a dopant (for example, an n-type dopant such as germanium (Ge), silicon (Si), oxygen or the like or a p-type dopant such as beryllium (Be), magnesium (Mg), calcium (Ca), strontium (Sr), zinc (Zn), cadmium (Cd) or the like), by elevating the temperature and pressure to 830 to 910° C. and 3.5 to 4.5 MPa under a nitrogen atmosphere, and then by rotating the crucible while the temperature and pressure are held. The holding time may be 10 to 100 hours, although it is different depending on the target film thickness.

Further, the thus obtained gallium nitride crystal produced by the Na flux method may preferably be subjected to grinding by a grinder to make the surface flat, and the surface may preferably be flattened by lapping using diamond grinding stones.

(Method of Separating the Layer of Crystal of the Group 13 Nitride)

Then, the layer of the crystal of the group 13 nitride may be separated from the single crystal substrate to obtain a free-standing substrate including the crystal layer of the group 13 nitride Here, the method of separating the crystal layer of the group 13 nitride from the single crystal substrate is not limited. According to a preferred embodiment, the crystal layer of the group 13 nitride is naturally separated from the single crystal substrate during a cooling step after growing the crystal layer of the group 13 nitride.

Alternatively, the crystal layer of the group 13 nitride may be separated from the single crystal substrate by chemical etching.

Etchants for performing the chemical etching may preferably be a strong acid such as sulfuric acid, chloric acid or the like, a mixed solution of sulfuric acid and phosphoric acid, or a strong alkali such as a sodium hydroxide aqueous solution, potassium hydroxide aqueous solution or the like. Further, the chemical etching may preferably be performed at a temperature of 70° C. or higher.

Alternatively, the crystal layer of the group 13 nitride may be peeled off from the single crystal substrate by the laser lift-off method.

Alternatively, the crystal layer of the group 13 nitride may be peeled off from the single crystal substrate by grinding.

Alternatively, the crystal layer of the group 13 nitride may be peeled off from the single crystal substrate with a wire saw.

(Free-Standing Substrate)

The crystal layer of the group 13 nitride may be separated from the single crystal substrate to obtain a free-standing substrate.

The term "free-standing substrate" as used in the present invention means a substrate that cannot be deformed or broken under its own weight during handling and can be handled as a solid. The free-standing substrate of the present invention can be used not only as a substrate for various types of semiconductor devices such as light-emitting devices, but also as a member or a layer other than the base material, such as an electrode (which may be a p-type electrode or an n-type electrode), a p-type layer, or an n-type layer. The free-standing substrate may include one or more of the other layers.

In the case that the crystal layer of the group 13 nitride forms the free-standing substrate, the free-standing substrate should have a thickness that allows for free-standing and preferably has a thickness of 20 μm or more, more preferably 100 μm or more, and further preferably 300 μm or more. No upper limit should be set on the thickness of the free-standing substrate, but it is realistic to have a thickness of 3000 μm or less in terms of manufacturing cost.

(Composite Substrate)

A single crystal substrate with the crystal layer of the group 13 nitride provided thereon can be used as a template substrate for forming another functional layer thereon without separating the crystal layer of the group 13 nitride.

(Functional Device)

The functional device structure provided on the crystal layer of the group 13 nitride is not particularly limited and may have a light-emitting function, rectifying function or electric power-controlling function.

The structure or production method of a light-emitting device using the crystal layer of the group 13 nitride of the present invention is not limited. Typically, the light-emitting device is produced by providing a light-emitting functional layer on the crystal layer of the group 13 nitride. Further, the crystal layer of the group 13 nitride may be used as an electrode (possible p-type electrode or n-type electrode), or a member or layer other than a p-type layer or n-type layer or the like to produce the light-emitting device.

Figure 8:
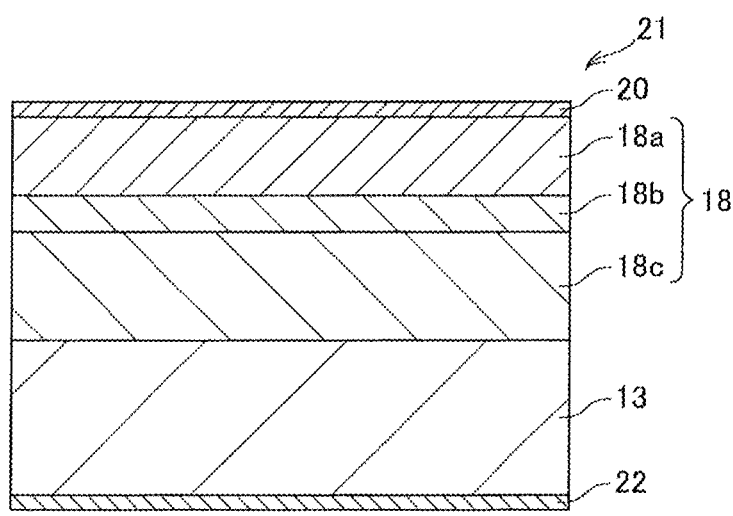
FIG. 8 is a diagram schematically showing a functional device 21 of the present invention.

FIG. 8 schematically shows the construction of layers according to an embodiment of the present invention. The light-emitting device 21 shown in FIG. 8 includes a free-standing substrate 13 and a light-emitting function layer 18 formed on the substrate. The light-emitting function layer 18 provides a light emission based on the principle of a light-emitting device, such as an LED or the like, by appropriately providing an electrode or the like and applying a voltage.

The light-emitting functional layer 18 is formed on the substrate 13. The light-emitting functional layer 18 may be provided entirely or partially on the surface of the substrate 13 or may be provided entirely or partially on a buffer layer to be described hereinafter if the buffer layer is formed on the substrate 13. The light-emitting functional layer 18 may take one of various known layer configurations that provide a light emission based on the principle of light-emitting devices as represented by LED's by appropriately providing electrodes and/or phosphors thereon and applying a voltage therebetween. Accordingly, the light-emitting functional layer 18 may emit a visible light of, for example, blue and red or may emit an ultraviolet light without or with a visible light. The light-emitting functional layer 18 preferably forms at least a part of a light-emitting device that exploits a p-n junction and the p-n junction may include an active layer 18b between a p-type layer 18a and an n-type layer 18c, as shown in FIG. 8. In this case, a double heterojunction or a single heterojunction (hereinafter referred to collectively as heterojunction) may be employed in which the active layer has a bandgap smaller than that of the p-type layer and/or the n-type layer. A quantum well structure in which the active layer is thinned may also be taken as one form of p-type layer/active layer/n-type layer. A double heterojunction in which the active layer has a bandgap smaller than that of the p-type layer and the n-type layer should obviously be employed to obtain a quantum well. Many quantum well structures may also be stacked to provide a multiple quantum well (MQW) structure. These structures have a higher luminous efficiency compared to a p-n junction. The light-emitting functional layer 18 thus preferably includes a p-n junction, a heterojunction, and/or a quantum well junction having a light-emitting feature. Further, 20 and 22 represents examples of electrodes.

Accordingly, one or more layers forming the light-emitting functional layer 18 can include at least one or more selected from the group consisting of the n-type layer with n-type dopants doped therein, the p-type layer with p-type dopants doped therein, and the active layer. In the n-type layer, the p-type layer, and the active layer (if it exists), the main components may be of the same material or may be of respectively different materials.

The material of each layer forming the light-emitting functional layer 18 is not particularly limited as long as it is grown in a manner generally following the crystal orientation of the crystal layer of the group 13 nitride and having a light-emitting function, but preferably includes one or more selected from a gallium nitride (GaN)-based material, zinc oxide (ZnO)-based material, and aluminum nitride (AlN)-based material as the main component and may appropriately contain dopants for controlling to be a p-type or n-type. A gallium nitride (GaN)-based material is particularly preferable. The material of the light-emitting functional layer 18 may be a mixed crystal with, for example, AlN, InN, etc. solid-solved in GaN to control the bandgap. As mentioned in the last paragraph, the light-emitting functional layer 18 may employ a heterojunction composed of multiple types of material systems. For example, the p-type layer may employ a gallium nitride (GaN)-based material, while the n-type layer may employ a zinc oxide (ZnO)-based material. Alternatively, the p-type layer may employ a zinc oxide (ZnO)-based material, while the active layer and the n-type layer may employ a gallium nitride (GaN)-based material, the combination of materials being not particularly limited.

The film formation method for the light-emitting functional layer 18 and the buffer layer is preferably exemplified by a gas phase method such as MOCVD, MBE, HVPE, and sputtering, a liquid phase method such as a Na flux method, ammonothermal method, hydrothermal method, and sol-gel method, a powder method utilizing the solid phase growth of powder, and combinations thereof, though not particularly limited as long as it is grown in a manner generally following the crystal orientation of the crystal layer of the group 13 nitride.

EXAMPLES

Inventive Example 1

(Production of Gallium Nitride Free-Standing Substrate)

An alumina film 2 with a thickness of 0.3 μm was film-formed by sputtering and a seed crystal film 3 composed of gallium nitride and with a thickness of 2 μm was film-formed by the MOCVD method on a sapphire substrate 1 with a diameter of 6 inches to provide a seed crystal substrate.

The seed crystal substrate was placed in an alumina crucible in a glove box filled with a nitrogen atmosphere. Then, gallium metal and sodium metal were filled in the crucible so that the Ga/Ga+Na (mol %) was 15 mol %, and the crucible was closed with an alumina plate. The crucible was contained in an inner container of stainless steel, which was then contained in an outer container of stainless steel capable of including it, and the outer container was then closed with a container lid equipped with a pipe for introducing nitrogen. The outer container was positioned on a rotatable table provided in a heating part of a crystal production system which was subjected to baking under a vacuum in advance, and a pressure-resistant container was sealed with a lid.

The inside space of the pressure-resistant container was then evacuated by a vacuum pump to a pressure or 0.1 Pa or less. While an upper heater, middle heater and lower heater were adjusted to heat the heated inside space to 870° C., nitrogen gas was introduced from a nitrogen gas bombe to 4.0 MPa, and the outer container was rotated around a central axis at a rate of 20 rpm clockwise and anti-clockwise at a predetermined interval. The acceleration time was 12 seconds, holding time was 600 seconds, deceleration time was 12 seconds and stopping time was 0.5 seconds. This state was maintained for 40 hours. Thereafter, the temperature and pressure were lowered to room temperature and atmospheric pressure through natural cooling, the lid of the pressure-resistant container was opened and the crucible was taken out from the inside. Solidified sodium metal in the crucible was removed to collect a gallium nitride free-standing substrate without cracks and separated from the seed crystal substrate.

(Evaluation)

Figure 9:
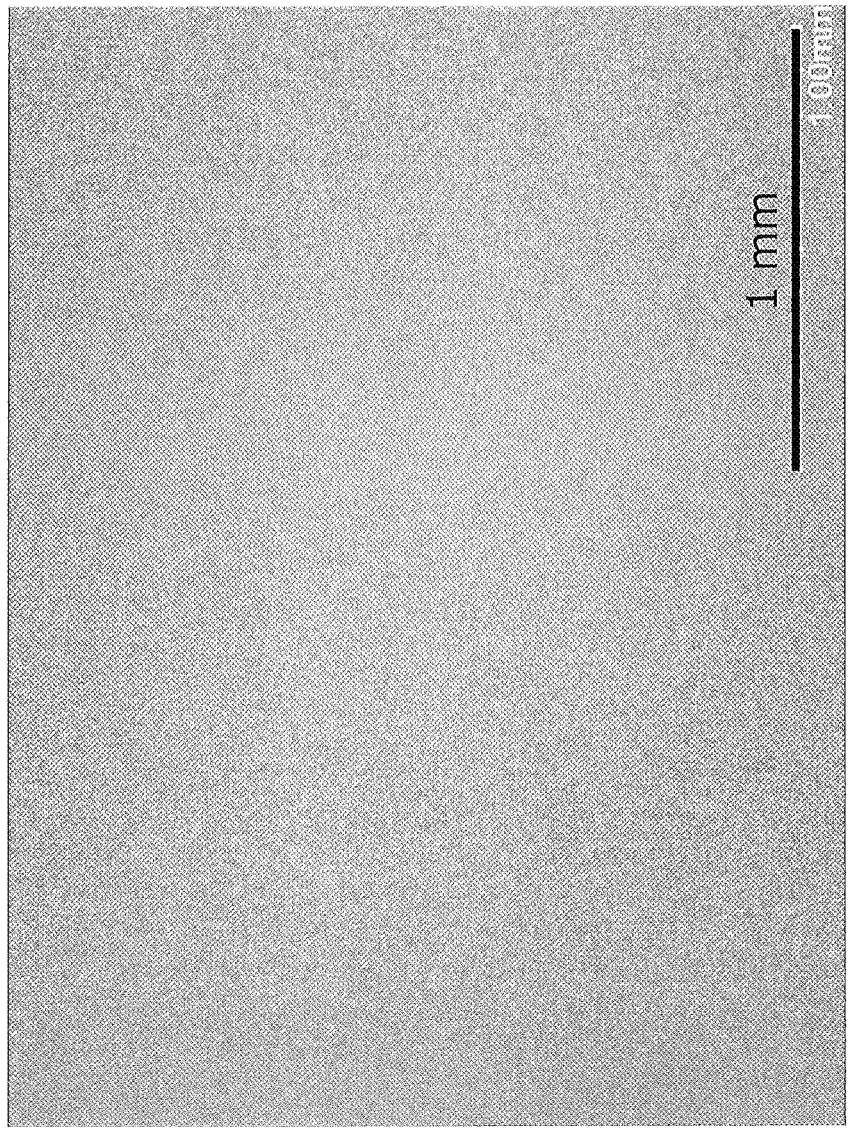
FIG. 9 is a photograph taken by a scanning type electron microscope of an upper surface of the layer of the crystal of the group 13 nitride.

The upper surface of the gallium nitride free-standing substrate was polished and observed by CL by means of a scanning type electron microscope (SEM) with a CL detector. As a result, as shown in FIG. 3, the high-luminance light-emitting parts emitting a white light inside of the gallium nitride crystal by the CL photograph were observed. Further, at the same time, as shown in FIG. 9, as the same visual field was observed by SEM, voids were not confirmed and an uniform gallium nitride crystal was proved to be grown.

Figure 7:
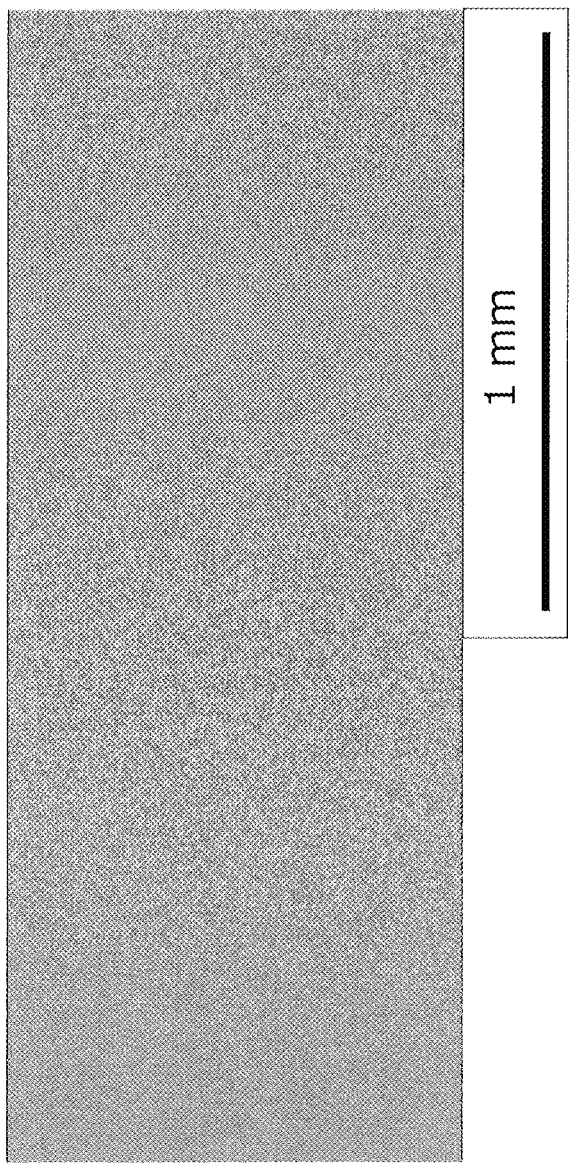
FIG. 7 is a photograph taken by a scanning type electron microscope showing a cross section of the layer 13 of the crystal of the group 13 nitride.

Further, the gallium nitride free-standing substrate was cut along a cross section perpendicular to the upper surface, and the cut cross section was polished and observed by CL by means of the scanning type electron microscope (SEM) with the CL detector. As a result, as shown in FIG. 6, the high-luminance light-emitting parts emitting a white light inside of the gallium nitride crystal by the CL photograph were observed. Further, at the same time, as shown in FIG. 7, as the same visual field was observed by SEM, voids were not confirmed and an uniform gallium nitride crystal was proved to be grown. That is, on the cross section of the crystal layer of the group 13 nitride, the same as the upper surface, the high-luminance light-emitting parts were present according to the CL observation, a microstructure having the same or similar shape of the high-luminance light-emitting part shown in the CL photograph was not present, according to the SEM.

(Measurement of dislocation density)

The dislocation density of the upper surface of the crystal layer of the group 13 nitride was measured. The CL observation was performed to measure the density of the dark spots at the dislocated positions so that the dislocation density was calculated. As a result of the observation of five visual fields, each having sizes of 80 μm×105 μm, it was deviated in a range of $1.2 \times 10^4/cm^2$ to $9.4 \times 10^4/m^2$ with an average of $3.3 \times 10^4/cm^2$.

(Measurement of Surface Tilt Angle)

The half value width at the (0002) plane of the X-ray rocking curve on the upper surface of the crystal layer of gallium nitride was measured, which was proved to be 73 seconds.

(Measurement of Surface Twist Angle)

The half value width at the (1000) plane of the X-ray rocking curve on the upper surface of the crystal layer of gallium nitride was measured, which was proved to be 85 seconds.

(Film Formation of Light-Emitting Function Layer by MOCVD Method)

Using an MOCVD method, on the free-standing gallium nitride substrate, as an n-type layer, an n-GaN layer of him at 1050° C. doped so that an atomic concentration of Si atoms became $5 \times 10^{18}/cm^3$ was deposited. Then, as a light-emitting layer, multiple quantum well layers at 750° C. were deposited. Specifically, five layers of well layers of 2.5 nm of InGaN and six layers of barrier layers of 10 nm of GaN were alternately deposited. Then, as a p-type layer, a p-type GaN in 200 nm at 950° C. doped so that an atomic concentration of Mg atoms became $1\times10^{19}/cm^3$ was deposited. Thereafter, it was taken out of an MOCVD apparatus and then subjected to heat treatment at 800° C. in a nitrogen atmosphere for 10 minutes as an activating treatment of Mg ions in the p-type layer.

(Production of Light-Emitting Device)

Using a photolithography process and vapor deposition method, on the opposite side of the n-GaN layer and p-GaN layer of the free-standing gallium nitride substrate, a Ti film, Al film, Ni film and Au film were patterned in thicknesses of 15 nm, 70 nm, 12 nm and 60 nm, respectively as a cathode electrode. Thereafter, for assuring an ohmic contact characteristic, heat treatment was performed at 700° C. for 30 seconds under a nitrogen atmosphere. Further, using a photolithography process and a vapor deposition method, a Ni film and Au film were patterned in thicknesses of 6 nm and 60 nm, respectively, as a transparent anode on the p-type layer. Thereafter, for assuring the ohmic contact characteristic, heat treatment was performed at 500° C. for 30 seconds under a nitrogen atmosphere. Further, using a photolithography process and a vapor deposition method, on a partial region of a top surface of the Ni and Al films as the transparent anode, a Ni film and Au film were patterned in thicknesses of 5 nm and 60 nm, respectively, as a pad for the anode, The thus obtained substrate was cut into chips, which were mounted on lead frames to obtain light-emitting devices of a vertical type structure.

(Evaluation of Light-Emitting Device)

A hundred samples were arbitrarily selected from the thus produced devices, and electricity was flown between the cathode and anode to perform the I-V measurement. Rectification was confirmed in 90 of the samples. Further, current was flown in the forward direction to confirm the luminescence of light of a wavelength of 460 nm.

(Production of a Device Having a Rectifying Function)

A functional device having a rectifying function was produced.

Specifically, a Schottky barrier diode structure was formed on the upper surface of the free-standing substrate obtained in the example, as follows, and electrodes were then formed thereon to obtain a diode, followed by the confirmation of the characteristics.

(Film Formation of Rectifying Function Layer by MOCVD Method)

An n-GaN layer having a thickness of 5 μm, on the free-standing substrate as an n-type layer using an MOCVD method (organic metal chemical vapor deposition) at 1050° C., so that it was doped with Si at an Si atom concentration of $1\times10^{16}/cm^3$.

Using a photolithography process and a vacuum deposition method, Ti/Al/Ni/Au films as an ohmic electrode were patterned on the surface on the side opposite to the n-GaN layer of the free-standing substrate in thicknesses of 15 nm, 70 nm, 12 nm, and 60 nm, respectively. Thereafter, to improve the ohmic contact characteristics, heat treatment at 700° C. was performed in a nitrogen atmosphere for 30 seconds. Furthermore, using a photolithography process and a vacuum deposition method, Ni/Au films were patterned as a Schottky electrode on the n-GaN layer formed by the MOCVD method in thicknesses of 6 nm and 80 nm, respectively. The substrate obtained in this way was cut into chips, which were mounted on lead frames to obtain the rectifying devices.

(Evaluation of Rectifying Device)

As a result of the I-V measurement, a rectifying property was confirmed.

(Production of Electric Power-Controlling Device)

A functional device having the function of controlling electric power was produced.

A free-standing substrate as the example was produced. However, different from the example 1, in producing the gallium nitride crystal by the Na flux method, the doping of the impurity was not performed. On the surface of the free-standing substrate obtained in this way, a HEMT structure of $Al_{0.25}Ga_{0.75}N/GaN$ by an MOCVD method was produced as follows, an electrode is formed, and the transistor characteristics were confirmed.

Using an MOCVD method (organic metal chemical vapor deposition), an n-GaN layer without the doping of the impurity in a thickness of 3 μm on the free-standing substrate as an i-type layer at 1050° C. was formed. The $Al_{0.25}Ga_{0.75}N$ layer was then produced as the functional layer of 25 nm at the same 1050° C. The HEMT structure of $Al_{0.25}Ga_{0.75}N/GaN$ was thus obtained.

Using a photolithography process and a vacuum deposition method, Ti/Al/Ni/Au films as source and drain electrodes were patterned in thicknesses of 15 nm, 70 nm, 12 nm, and 60 nm, respectively. Thereafter, to improve the ohmic contact characteristics, 700° C. heat treatment was performed in a nitrogen atmosphere for 30 seconds. Furthermore, using a photolithography process and a vacuum deposition method, Ni/Au films were patterned as a gate electrode by a Schottky junction in thicknesses of 6 nm and 80 nm, respectively. The thus obtained substrate was cut into chips, which were mounted on lead frames to obtain the devices having the function of controlling electric power.

(Evaluation of Electric Power-Controlling Device)

When the I-V measurement was performed, good pinch-off characteristics were confirmed, in which the maximum drain current was 710 mA/mm and maximum transconductance was 210 mS/mm.

The invention claimed is:

1. A layer of a crystal of a nitride of a group 13 element, said crystal of said nitride being selected from gallium nitride, aluminum nitride, indium nitride and the mixed crystals thereof and said layer comprising an upper surface and a bottom surface, wherein said upper surface consists essentially of a linear high-luminance light-emitting part and low-luminance light-emitting regions provided on both sides of said high-luminance light-emitting part, respectively, said linear high-luminance light-emitting part forms a continuous phase, said low-luminance light-emitting regions each forms a discontinuous phase divided by said linear high-luminance light-emitting part, and said high-luminance light-emitting part comprises a portion extending along an m-plane of said crystal of said nitride of said group 13 element, said upper surface being observed by cathode luminescence.

2. The layer of said crystal of said nitride of said group 13 element of claim 1, wherein said high-luminance light-emitting part substantially extends along said m-plane of said crystal of said nitride of said group 13 element.

3. The layer of said crystal of said nitride of said group 13 element of claim 1, wherein a half value width of reflection at (0002) plane of an X-ray rocking curve on said upper surface is 3000 seconds or lower and 20 seconds or higher.

4. The layer of said crystal of said nitride of said group 13 element of claim 1, wherein voids are not observed on a cross section substantially perpendicular to said upper surface of said layer of said crystal of said nitride of said group 13 element.

5. The layer of said crystal of said nitride of said group 13 element of claim 1, wherein a dislocation density on said upper surface of said layer of said crystal of said nitride of said group 13 element is $1 \times 10^6/\text{cm}^2$ or lower.

6. The layer of said crystal of said nitride of said group 13 element of claim 5, wherein said dislocation density on said upper surface of said layer of said crystal of said nitride of said group 13 element is $1 \times 10^2/\text{cm}^2$ or higher and $1 \times 10^6/\text{cm}^2$ or lower.

7. The layer of said crystal of said nitride of said group 13 element of claim 1, wherein a half value width of reflection at (1000) plane of an X-ray rocking curve on said upper surface is 10000 seconds or lower and 20 seconds or higher.

8. The layer of said crystal of said nitride of said group 13 element of claim 1, wherein said nitride of said group 13 element comprises a gallium nitride series nitride.

9. A free-standing substrate comprising said layer of said crystal of said nitride of said group 13 element of claim 1.

10. A functional device comprising:
said free-standing substrate of claim 9; and
a functional layer provided on said layer of said crystal of said nitride of said group 13 element.

11. The functional device of claim 10, wherein
said functional layer has a function of light-emitting function, rectifying function or electric power-controlling function.

12. A composite substrate comprising:
a supporting body; and
said layer of said crystal of said nitride of said group 13 element of claim 1 provided on said supporting body.

13. A functional device comprising:
said composite substrate of claim 12; and
a functional layer provided on said layer of said crystal of said nitride of said group 13 element.

14. The functional device of claim 13, wherein
said functional layer has a function of light-emitting function, rectifying function or electric power-controlling function.

15. The layer of said crystal of said nitride of said group 13 element of claim 1, wherein
a cross section of said layer, substantially perpendicular to said upper surface of said layer, comprises a linear high-luminance light-emitting part and low-luminance light-emitting regions extended two-dimensionally, and
said high-luminance light-emitting part is elongated linearly to form a boundary line dividing said low-luminance light-emitting regions adjacent to each other, said cross section being observed by cathode luminescence.

* * * * *